United States Patent
Ko et al.

(10) Patent No.: US 10,389,300 B2
(45) Date of Patent: Aug. 20, 2019

(54) PHOTOVOLTAIC SYSTEM HAVING FAULT DIAGNOSIS APPARATUS, AND FAULT DIAGNOSIS METHOD FOR PHOTOVOLTAIC SYSTEM

(71) Applicant: KOREA INSTITUTE OF ENERGY RESEARCH, Daejeon (KR)

(72) Inventors: Sukwhan Ko, Sejong-si (KR); Youngseok Jung, Daejeon (KR); Gi-Hwan Kang, Sejong-si (KR); Youngchul Ju, Daejeon (KR); Hyemi Hwang, Daejeon (KR); Junghun So, Daejeon (KR); Hee-eun Song, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 188 days.

(21) Appl. No.: 15/309,215

(22) PCT Filed: Oct. 8, 2015

(86) PCT No.: PCT/KR2015/010647
§ 371 (c)(1),
(2) Date: Nov. 7, 2016

(87) PCT Pub. No.: WO2016/117797
PCT Pub. Date: Jul. 28, 2016

(65) Prior Publication Data
US 2017/0063304 A1  Mar. 2, 2017

(30) Foreign Application Priority Data
Jan. 19, 2015 (KR) .................. 10-2015-0008517

(51) Int. Cl.
*H02J 1/00* (2006.01)
*H02J 3/00* (2006.01)
(Continued)

(52) U.S. Cl.
CPC .......... *H02S 50/10* (2014.12); *H01L 31/0201* (2013.01); *H02S 40/32* (2014.12);
(Continued)

(58) Field of Classification Search
CPC .......... H02S 50/10; H02S 40/32; H02S 40/34; H01L 31/0201; Y02E 10/563; H02J 3/383
(Continued)

(56) References Cited

FOREIGN PATENT DOCUMENTS

| JP | 2012-204610 A | 10/2012 |
|----|---------------|---------|
| KR | 10-2000-0002864 A | 1/2000 |

(Continued)

OTHER PUBLICATIONS

Chinese Office Action dated Apr. 2, 2018.

*Primary Examiner* — Richard Tan
(74) *Attorney, Agent, or Firm* — Rabin & Berdo, P.C.

(57) ABSTRACT

The present invention relates to a fault diagnosis for a photovoltaic system. A fault diagnosis apparatus includes a temperature sensor unit measuring both an internal temperature value of the junction box and a surface temperature value of the solar module; a voltage sensor provided in the junction box; and an operation unit determining where a fault occurs among the solar module, an inside of the junction box, and the inverter by comparing measured values of the temperature sensor unit with a measured value of the voltage sensor. According to the present invention, initial investment cost is inexpensive. In addition, it is possible to detect solar module faults that are difficult to be checked by the naked eye.

13 Claims, 9 Drawing Sheets

(51) Int. Cl.
   *H02S 50/10* (2014.01)
   *H02S 40/32* (2014.01)
   *H02S 40/34* (2014.01)
   *H01L 31/02* (2006.01)
   *H02J 3/38* (2006.01)

(52) U.S. Cl.
   CPC ............... *H02S 40/34* (2014.12); *H02J 3/383* (2013.01); *Y02E 10/563* (2013.01)

(58) Field of Classification Search
   USPC .......................................................... 307/84
   See application file for complete search history.

(56) References Cited

FOREIGN PATENT DOCUMENTS

| | | |
|---|---|---|
| KR | 10-0919065 B1 | 9/2009 |
| KR | 10-0970280 B1 | 7/2010 |
| KR | 10-1306817 B1 | 9/2013 |

PHOTOVOLTAIC SYSTEM HAVING FAULT DIAGNOSIS APPARATUS, AND FAULT DIAGNOSIS METHOD FOR PHOTOVOLTAIC SYSTEM

TECHNICAL FIELD

The present invention relates to fault diagnosis for a photovoltaic system. More particularly, it relates to a photovoltaic system having a fault diagnosis apparatus and a fault diagnosis method for the photovoltaic system, the fault diagnosis apparatus determining whether or not the photovoltaic system has a fault by measuring a temperature value and a voltage value of the system.

BACKGROUND ART

The greenhouse effect caused by excessive use of fossil fuels has become a serious problem. In order to solve this problem, research into alternative energies is ongoing. Representative examples of alternative energy are wind power, wave power, and solar energy.

Recently, technology for power generation using solar energy has become competitive due to a dissemination of technology related to renewable energy, a decrease in solar cell cost, etc. In addition, the technology is being standardized. FIG. 1 is a view showing an example of a photovoltaic (PV) system disclosed in Korea Patent Application Publication No. 10-2000-0002864. As shown in FIG. 1, each of solar (or photovoltaic) modules (or panels) a, . . . , c, d, e includes a plurality of solar cells a1, . . . , e1, . . . , and a communication device 4. A central server 5, which is far from the solar modules, controls, maintains, and monitors the solar modules through the communication device 4.

However, it is difficult to check solar module faults (short-circuit, disconnection, etc.) by naked eye. Also, the faults rarely occur in newly established systems. Furthermore, in spite of monitoring voltage, current, power of each string at an end of an inverter, when some of the solar cells do not operate, it is difficult to determine whether or not the system has faults due to operation of a bypass diode.

In addition, it is particularly difficult to check inverter faults or bypass diode faults because results of the faults are similar to results of the solar module faults. Furthermore, the inverter faults or the bypass diode faults cause an increase in temperature of the solar modules, and thus, the solar modules will have great deterioration. Therefore, a method or device for determining whether or not the inverter or the bypass diode has a fault is required.

FIG. 2 is a view showing a fault diagnosis technology for solar modules disclosed in Korean Patent No. 10-0919065. Referring to FIG. 2, a solar power generating apparatus 50 includes a solar array 2 having a plurality of solar subarray 2a, 2b, 2c and 2d, and an operation unit 3 communicating with the solar array 2. The solar subarray 2a, 2b, 2c and 2d includes solar panels 1a-1, . . . , 1d-10, communication units 16a-1, . . . 16d-10, a voltage detecting unit, a controller, a power unit, and a charging unit. A solar panel communicates with an adjacent solar panel through the communication unit. When a solar panel has a fault, a prior solar panel transmits both an operation state of itself and an operation state of the faulty solar panel to a next solar panel. The voltage detecting unit operated by power of the charging unit detects a voltage value of electric energy generated by the solar cell array of a solar panel. When the detected voltage value is beyond a preset reference value range, it is determined that the solar panel has a fault, and a fault signal is transmitted to an adjacent solar panel. The fault signal is transmitted to the operation unit 3. Therefore, the solar power generating apparatus 50 may simply check the faulty solar panel without a manual checking process.

However, measuring voltage, current, and etc. for each solar panel requires excessive initial investment costs. Therefore, consumers do not prefer a photovoltaic system using the fault diagnosis technology, and thus, business value and efficiency in generating renewable energy are reduced.

In addition, a monitoring system for solar power generation is disclosed in Korean Patent No. 10-0970280. The monitoring system includes a tracking detection unit, a generated electricity amount detecting unit, a temperature detecting unit, a local controller, and a communication unit. The monitoring system determines the solar module has a tracking error when a temperature value detected by the temperature detecting unit is beyond a preset range. That is, a fault diagnosis by measuring a temperature value by the temperature detecting unit disclosed in Korean Patent No. 10-0970280 is used to detect the tracking error, etc. Therefore, the fault diagnosis is unable to detect solar cell faults, etc. As shown in FIG. 2, diagnosis of a solar cell fault is performed by detecting voltage or current that has the same problem as the technology of FIG. 2.

Documents of Related Art

1. Korean Patent Application Publication No. 10-2000-0002864 (publication date: Jan. 15, 2000)
2. Korean Patent No. 10-0919065 (registration date: Sep. 18, 2009)
3. Korean Patent No. 10-0970280 (registration date: Jul. 7, 2010)

DISCLOSURE

Technical Problem

The present invention has been proposed to solve the problems in the related art, and is intended to detect faults, which are difficult to be checked by the naked eye, of a solar module, an inverter, a bypass diode, etc. of a photovoltaic system.

Technical Solution

In order to achieve the above object, according to one aspect of the present invention, there is provided a fault diagnosis apparatus of a photovoltaic system, the photovoltaic system including: a solar module including a plurality of solar cells arranged in a grid; a junction box having a bypass diode and connected to the solar module to output direct current power generated by the solar module; an inverter converting the direct current power generated by the solar module into alternating current power required for an electric load; and a server communication unit communicating with the solar module, the fault diagnosis apparatus including: a temperature sensor unit measuring both an internal temperature value of the junction box and a surface temperature value of the solar module; a voltage sensor provided in the junction box; and an operation unit determining where a fault occurs among the solar module, the bypass diode, and the inverter by referring to measured values of the temperature sensor unit and a measured value of the voltage sensor.

According to another aspect, there is provided a fault diagnosis method for the photovoltaic system having the fault diagnosis apparatus, the method including: measuring, by the surface temperature sensor at a reference temperature value measuring step, the temperature value change of each solar module for the preset time when the solar module is in the normal operating condition generating the direct current power, and storing the temperature value change as the reference temperature value change; measuring, at a fault range setting step, the fault temperature value change of the solar module for the preset time when the solar module has a fault, and setting a difference between the reference temperature value change and the fault temperature value change in the same time period as the fault range; measuring, by the surface temperature sensor at an operation temperature value measuring step, the operation temperature value change of the solar module for the preset time, and transmitting the information about the operation temperature value change, the solar module generating the direct current power; and determining, by the operation unit at a fault diagnosis step, that the solar module has a fault when a difference between the reference temperature value change and the operation temperature value change exceeds the fault range in the same time period.

According to still another aspect, there is provided a fault diagnosis method for the photovoltaic system having the fault diagnosis apparatus, the method including: monitoring the surface temperature sensor and the internal temperature sensor; obtaining the measured value of the voltage sensor, when the measured temperature values of the surface temperature sensor and the internal temperature sensor are respectively higher than those of the normal operation condition; determining whether or not the inverter has a fault by comparing the measured value of the voltage sensor with an open-circuit voltage value of a solar module array, when the measured value of the voltage sensor is higher than that of the normal operation condition; and determining whether or not one of the solar module and the bypass diodes have faults by obtaining the measured temperature value of the internal temperature sensor, when the measured value of the voltage sensor is lower than that of the normal operation condition, wherein there is no temporal order between the determining of whether or not the inverter has a fault and the determining of whether or not one of the solar module and the bypass diodes have faults.

Advantageous Effects

According to the present invention, the temperature sensor and the voltage sensor are provided in the junction box such that initial investment costs can be inexpensive. In addition, the solar module faults, which are difficult to be determined by the naked eye, can be easily determined, and the inverter and bypass diode faults can be easily detected. Therefore, costs, time, efforts for operating and maintaining the photovoltaic system can be remarkably reduced. In addition, durability of the photovoltaic system can be remarkably enhanced.

MODE FOR INVENTION

Hereinafter, exemplary embodiments of the present invention will be described in detail with reference to the accompanying drawings. Specific structural and functional descriptions of embodiments of the present invention disclosed herein are only for illustrative purposes of the embodiments of the present invention. The present invention may be embodied in many different forms without departing from the spirit and significant characteristics of the present invention.

Therefore, the embodiments of the present invention are disclosed only for illustrative purposes and should not be construed as limiting the present invention.

The present invention relates to a photovoltaic system having a fault diagnosis apparatus, and to a fault diagnosis method for the photovoltaic system. The fault diagnosis method for the photovoltaic system includes a first exemplary embodiment shown in FIG. 5a, and a second exemplary embodiment shown in FIG. 5b. The second exemplary embodiment relates to a method of determining whether or not a solar module, an inverter, and a bypass diode of the photovoltaic system have faults. Hereinafter, a photovoltaic system having a fault diagnosis apparatus will be described, and next, the two exemplary embodiments of a fault diagnosis method for the photovoltaic system will be described.

The photovoltaic system having the fault diagnosis apparatus includes a solar module, a junction box, an inverter, a temperature sensor unit, a voltage sensor, and an operation unit. The solar module includes a plurality of solar cell panels arranged in a grid. The solar cell panel is an arrangement of solar cells electrically connected to each other.

Figure 1:
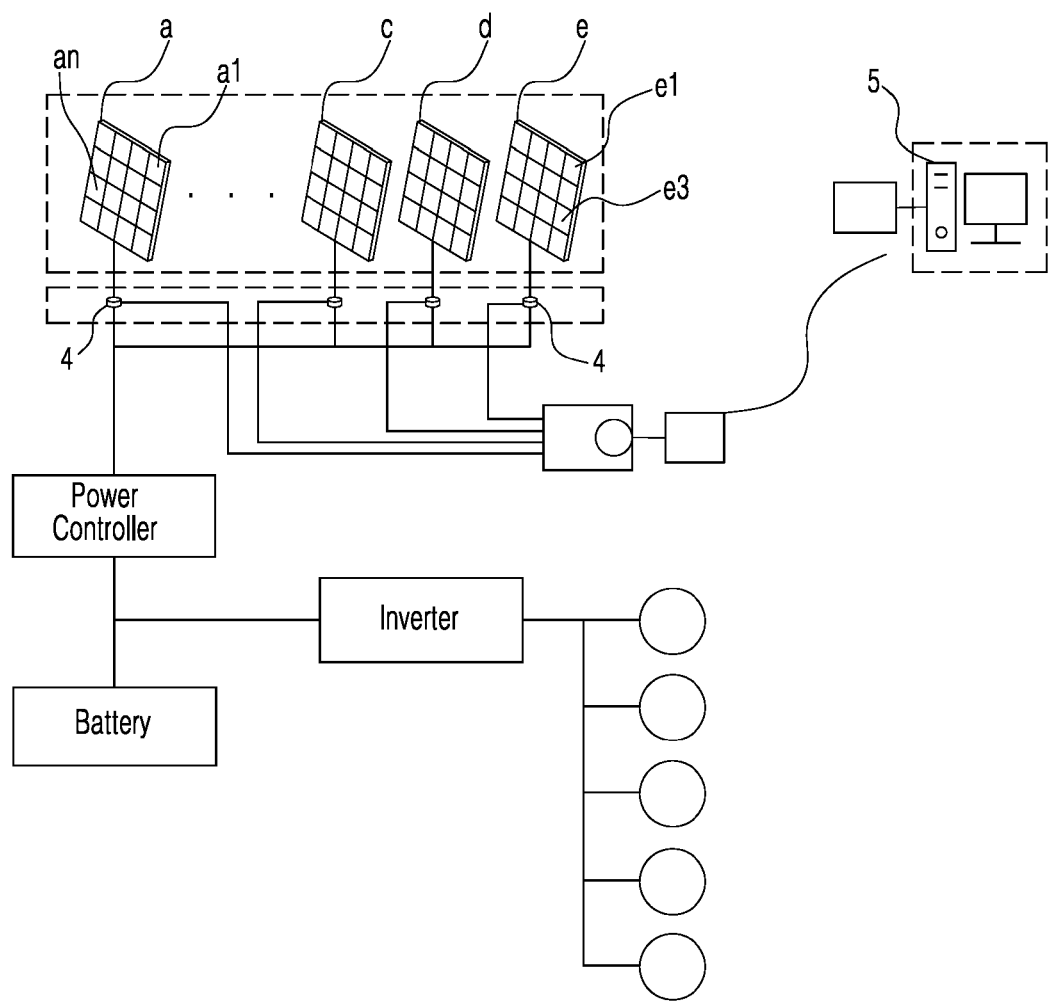
FIG. 1 is a view showing a photovoltaic system disclosed in the related art document 1.
Figure 2:
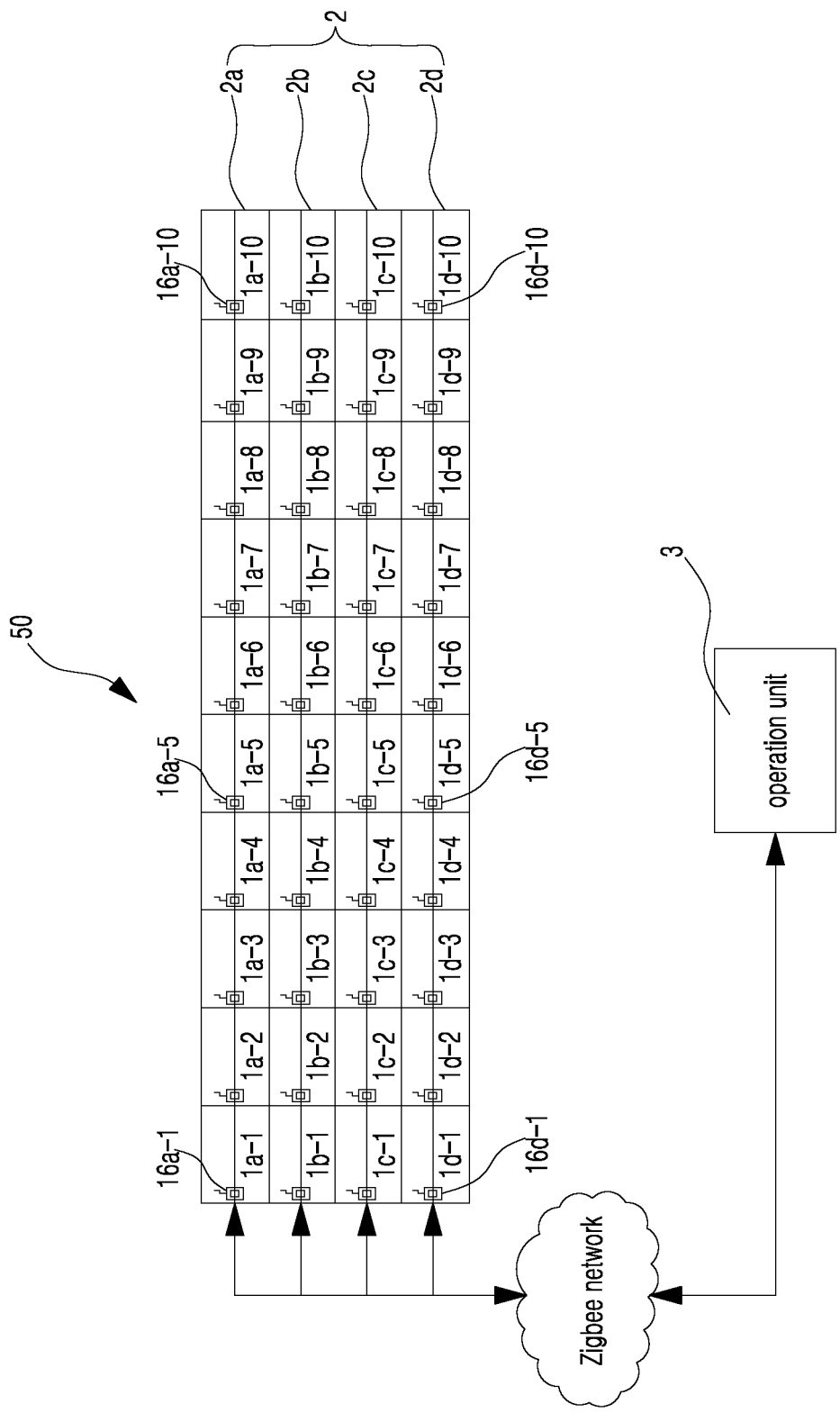
FIG. 2 is a view showing a fault diagnosis technology for solar modules disclosed in the related art document 2.
Figure 3:
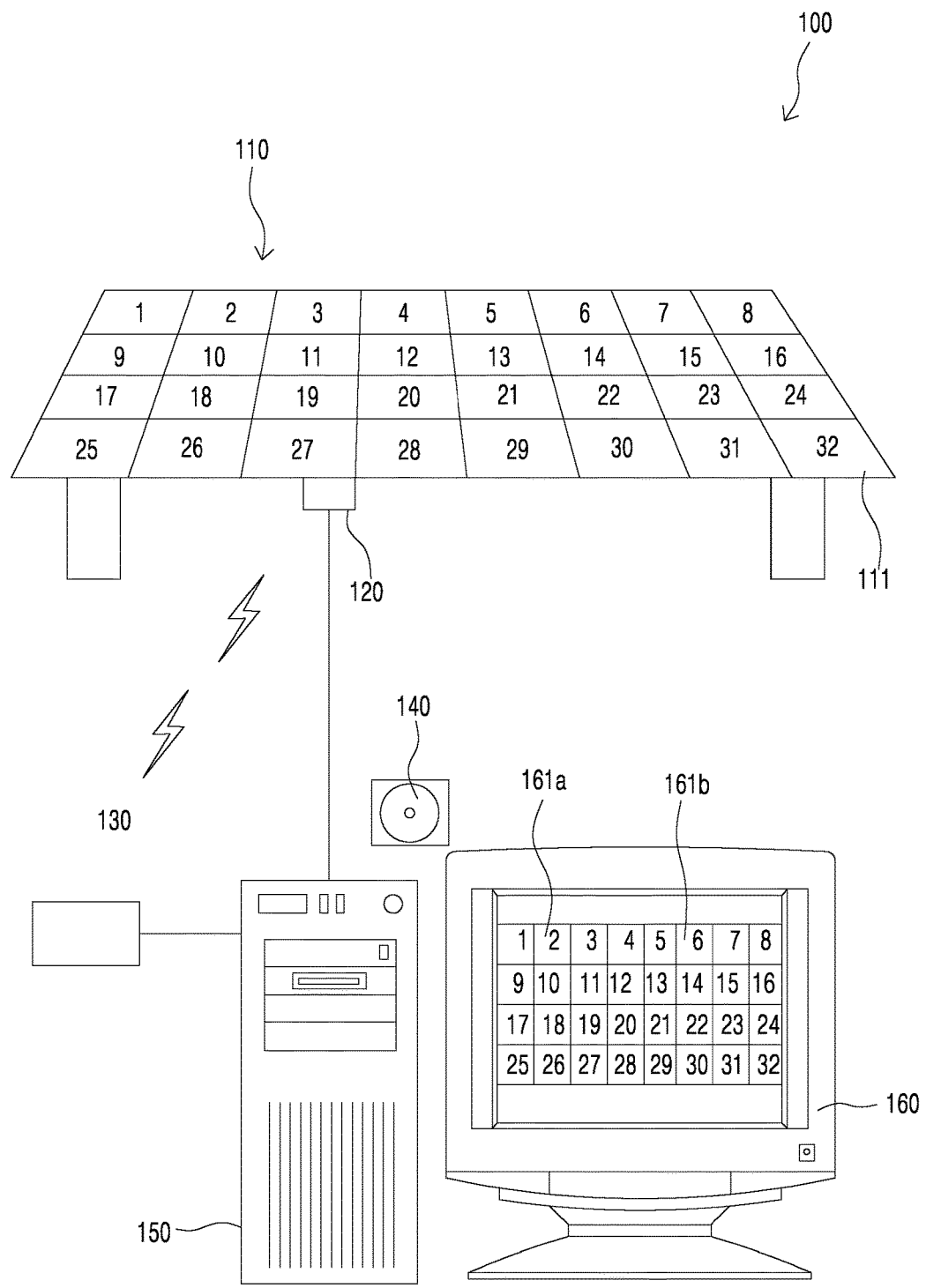
FIG. 3 is a configuration diagram showing a photovoltaic system having a fault diagnosis apparatus.

As shown in FIG. 3, the solar array 110 includes a plurality of solar panels 111 arranged in a grid. The solar array 110 may be provided with a controller for controlling the solar array 111; a driving module changing a direction of the solar array 110 when the array has a sun tracing function; and a power unit supplying a generated electric power to a rechargeable battery or an external device.

In addition, the solar cell array unit is a plurality of solar cells arranged in a grid. The solar cells in a row are electrically connected to each other. In addition, solar cell array units may be stacked in order to enhance electric power generation efficiency.

The power unit receives electric power generated by solar panels 111, and performs electric power processing that converts the electric power into a stable electric power by converting waveforms, by removing ripple, by performing rectification, by inverting direct current electricity, etc. Next, the power unit outputs the stable electric power to a power control unit supplying the stable electric power to the rechargeable battery or the external device.

In order to identify each of the solar panels 111, the solar panels 111 have identifiers such as serial numbers, for example, 1, 2, 3, 4, 5, . . . 32, as shown in the solar panels 111 of FIG. 3. In addition, each solar array 110 including the solar panels 111 may have an identifier in order to identify each solar array 110.

In addition, a temperature detecting unit may be provided on each solar array 110. The identifiers may be provided in a non-volatile memory of a controller (not shown) controlling the solar array 110. Alternatively, the identifiers of solar modules are stored in respective solar panels 111.

Figure 4:
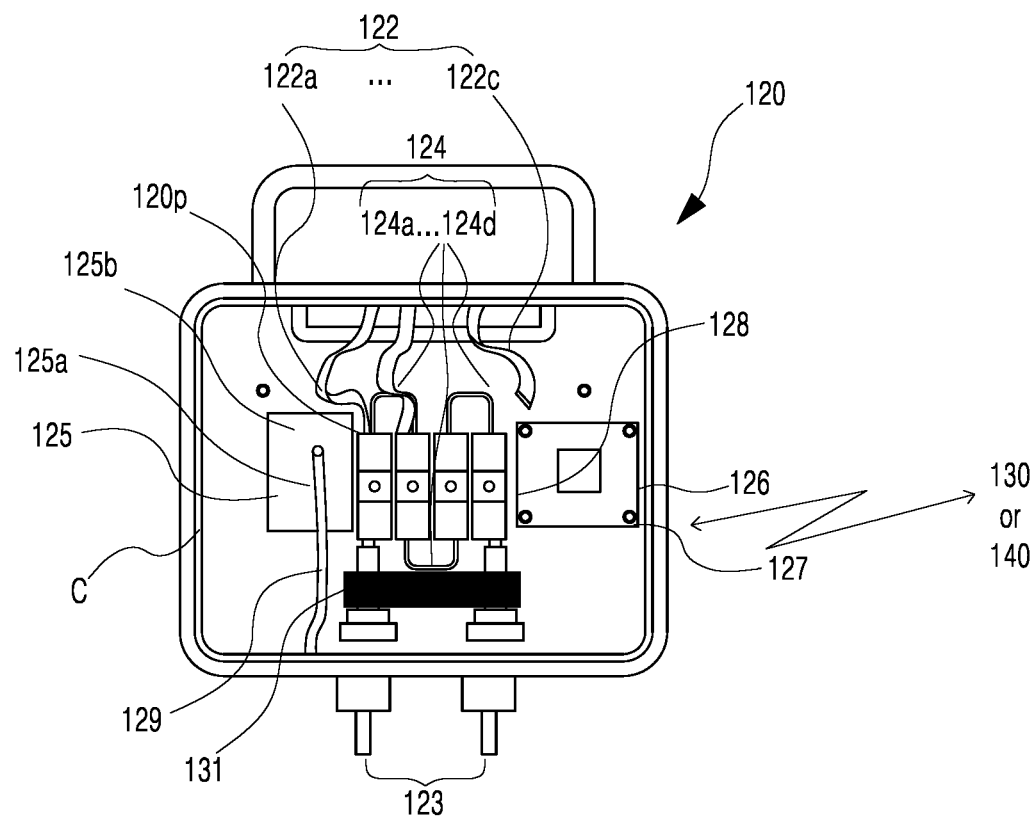
FIG. 4 is a view showing a junction box 120 of FIG. 3.

The junction box includes a terminal connected to the solar module to output the electric power generated by the solar module. As shown in FIG. 4, the junction box 120 includes: bus bars 122 having first ends respectively connected to lines of the solar cells of the solar module; a connection terminal unit 120P connected to second ends of the bus bars 122; an output power line unit 123 connected to the connection terminal unit 120P to output the electric power generated by the solar array 110; a bypass diode unit 124 including bypass diodes connecting the bus bars 122 to each other; a case unit C including the connection terminal unit 120P and the bypass diode unit 124; a temperature sensor unit 125 measuring an operation temperature value of an inside of the case unit C at preset time intervals during operation of the solar array 110; and a junction box communication unit 126 converting the measured operation temperature value into a measured temperature value signal, and transmitting the measured temperature value signal to an external fault diagnosis unit.

An inverter 730 (referring to FIG. 7) is a device converting direct current power generated by the solar module into alternating current power required for an electric load. One inverter may be provided at one solar subarray 10 including a plurality of the solar array 110 connected to each other. Alternatively, one inverter 730 may be connected to a plurality of solar subarrays 10. For reference, one inverter 730 is connected to one solar subarray 10 in the second exemplary embodiment of a fault diagnosis method for the photovoltaic system.

The temperature sensor unit 125 is a device measuring both an internal temperature value of the junction box 120 and a surface temperature value of the solar array 110. Specifically, referring to FIG. 4, the temperature sensor unit 125 includes a surface temperature sensor 125b measuring the surface temperature value of the solar array 110; an internal temperature sensor 125a measuring the internal temperature value of the junction box 120; a temperature value signal generating unit (not shown) generating a temperature value signal by adding an identifier of the solar module to the measured temperature values of the internal temperature sensor 125a and the surface temperature sensor 125b; and the junction box communication unit 126 transmitting the temperature value signal generated by the temperature value signal generating unit to the fault diagnosis unit.

The junction box communication unit 126 transmits the temperature value signal to the operation unit 150 of FIG. 3, which is an example of the fault diagnosis unit. Here, the temperature sensors 125a and 125b are connected to the junction box communication unit 126 through a temperature sensor line unit 129. Here, the junction box communication unit 126 adds an identifier of a solar array 110, which is connected to the junction box 120, to both the surface temperature value of the solar module and the internal temperature value of the junction box measured by the temperature sensors 125a and 125b, thereby generating the temperature value signal. Next, the junction box communication unit 126 transmits the temperature value signal to the operation unit 150 via wired or wireless network. That is, the temperature sensors 125a and 125b may be thermocouple temperature sensors transmitting the temperature value signal to the operation unit 150 by using a wired network. Alternatively, the temperature sensors 125a and 125b may be thermostat sensors transmitting the temperature value signal to the operation unit 150 via a router unit 130 by using a ZigBee network which is a wireless network. In addition, the temperature sensors 125a and 125b may be temperature measuring sensors using optical spectrum analysis, thermoelectric sensors, etc.

The junction box communication unit 126 receives the electric power generated from the solar array 110 through a driving power line unit 128. Therefore, the junction box communication unit 126 includes an electricity inverting unit stabilizing direct current power generated by the solar array 110, and inverting into alternating current power for supply; a communication unit including a communication protocol for transmitting the temperature value signal; and a communication board including an antenna 127 for a wireless communication with an external device.

In addition, the temperature sensor unit 125 including the temperature sensors 125a and 125b and the junction box communication unit 126 may be detachably attached at the inside of the junction box 120. Therefore, it is possible to apply a fault diagnosis function to a solar module that does not have the fault diagnosis function.

The temperature sensor unit 125 repeatedly generates information about temperature change of the solar array 110 at preset time intervals, or once a day to reduce power consumption for transmitting the information about temperature change. Next, the temperature sensor unit 125 transmits the information to the operation unit 150, and the junction box communication unit 126 may be in a sleep mode. However, it is desirable that the surface temperature value of the solar array 110 and the internal temperature value of the junction box 120 are measured during a maximum solar radiation period, and transmitted to the operation unit 150, and the junction box communication unit 126 is in a sleep mode, thereby reducing power consumption.

The junction box communication unit 126 uses various wide area networks or near field communications such as a typical RF communication, Bluetooth, etc. or a wired network using communication channels in series or in parallel. Thus, it is possible to transmit the surface temperature value of the solar array 110 and the internal temperature value of the junction box 120 measured by the temperature sensor unit 125 during operation of the solar array 110, and to transmit the temperature value signal including the identifier of the solar array 110 to the operation unit 150. Here, when the junction box communication unit 126 transmits the temperature value signal by using a wireless network, the temperature value signal including the measure temperature values is transmitted via a wireless network. The router unit 130 receives the temperature value signal, and transmits it to the operation unit 150.

The router unit 130 receives temperature value signals of the junction box 120 via a wireless network, and stores identifiers of the solar array 110 or of the solar panels 111 to identify senders. The router unit 130 transmits the temperature value signals to the operation unit 150 through an operation communication unit 140. Here, when a plurality of the operation units 150 is included, the router unit 130 connects the solar array 110 and respective operation units 150. To this end, the router unit 130 includes a table of identifiers of solar array 110, and a table of addresses of operation units 150.

Also, the operation communication unit 140, uses various wide area networks, or near field communications such as a typical RF communication, Bluetooth, etc., or a wired network using communication channels in series or in parallel.

The operation unit 150 determines whether each solar array 110 has a fault by receiving the temperature value signal from the junction box 120, and comparing with a preset reference temperature value change or with fault diagnosis ranges.

A photovoltaic system 100 determines whether a solar array 110 has whole faults or partial faults by using both the surface temperature value of the solar array 110 and the internal temperature value of the junction box 120. The temperature values are measured by the temperature sensor unit 125 of the junction box 120 provided at the solar array 110 during operation of the solar array 110, and are transmitted. Fault diagnosis information indicates that the solar array 110 has whole faults or partial faults, and is displayed on the display unit 160. Therefore, unlike conventional technologies, the present embodiment may easily determine whether or not the solar array 110 has faults by using the surface temperature value of the solar array 110 and the internal temperature value of the junction box 120 without a method or device measuring voltage or current of solar module. Measuring a temperature change during operation of the solar array 110 means that the internal temperature values of the junction box 120 are measured for a preset time. The internal temperature values are continuously transmitted to the operation unit 150. Or the internal temperature values are stored in an internal memory, and after a preset time the stored values are transmitted to the operation unit 150.

The operation unit 150 computes a temperature value change of the inside of the junction box 120 measured for a preset time during operation of the solar module (or panel) 111. Here, the temperature value change may be a reference temperature value change, an operation temperature value change, etc. In the meantime, the reference temperature value change is a temperature value change of the solar module measured for a preset time when the solar module is normal and in a normal operating condition. Here, the preset time for calculating the reference temperature value change can be chosen, for example, among a day, a month, and a season.

The fault temperature value change of the solar module is measured for a preset time when the solar module has a fault. The fault temperature value change is measured in an open-circuit state or in a short-circuit state of the solar module, or both. In addition, the operation unit also determines the solar module has a fault when the operation unit is impossible to receive information about the operation temperature value change of the solar module.

Figure 5A:
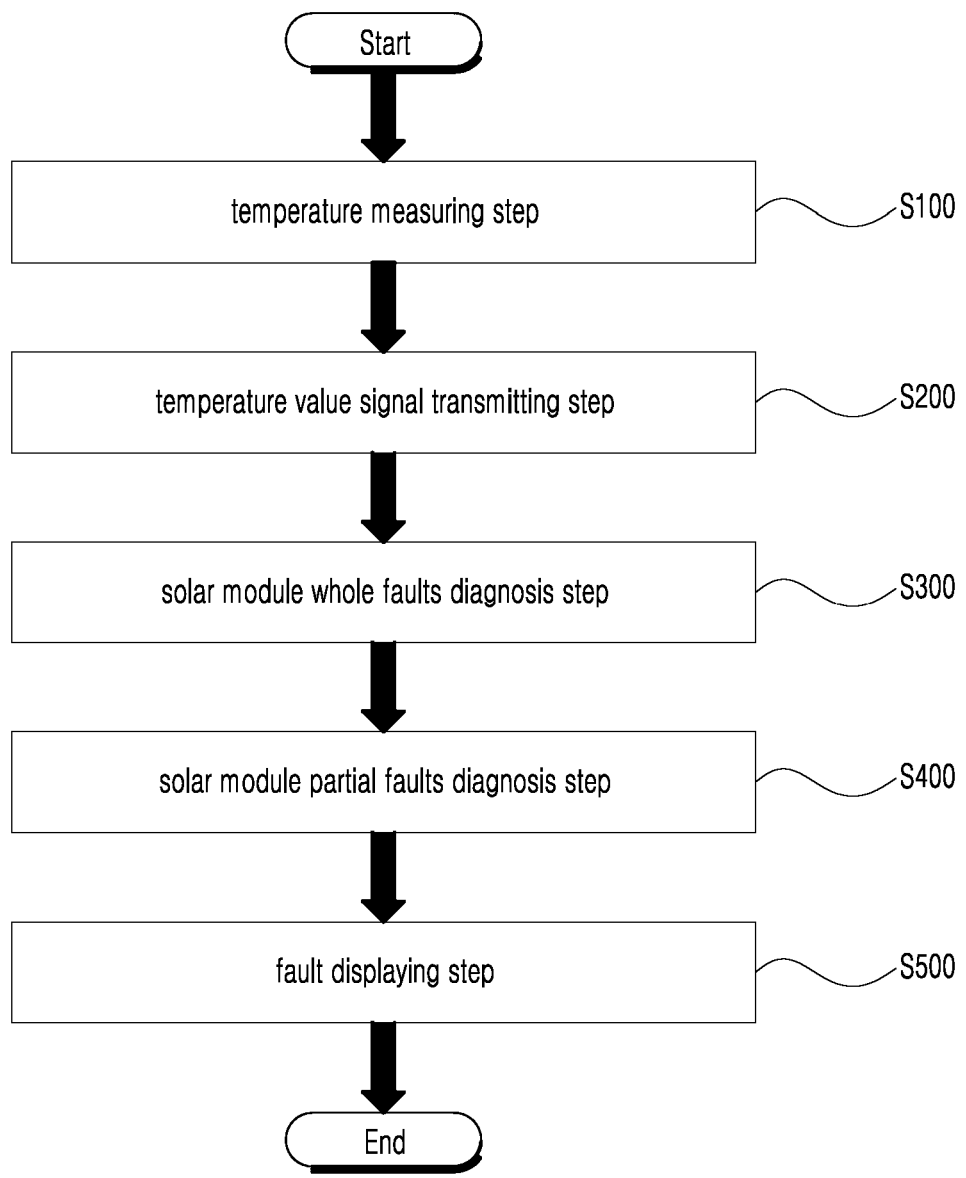
FIG. 5a is a flowchart showing a first exemplary embodiment of a fault diagnosis method for the photovoltaic system.

Hereinafter, a first exemplary embodiment of a fault diagnosis method for the photovoltaic system shown in FIG. 5*a* will be described. FIG. 5*a* is a flowchart showing a process of the fault diagnosis method for the photovoltaic system.

As shown in FIG. 5*a*, the fault diagnosis method for the photovoltaic system having the fault diagnosis apparatus includes: measuring, by the surface temperature sensor at a reference temperature value measuring step, the temperature value change of each solar module for the preset time when the solar module is in the normal operating condition, and storing the temperature value change as the reference temperature value change; measuring, at a fault range setting step, the fault temperature value change of the solar module for the preset time when the solar module has a fault, and setting a difference between the reference temperature value change and the fault temperature value change in the same time period as the fault range; measuring, by the surface temperature sensor at an operation temperature value measuring step, the operation temperature value change of the solar module for the preset time, and transmitting the information about the operation temperature value change, the solar module generating the direct current power; and determining, by the operation unit at a fault diagnosis step, the solar module has a fault when a difference between the reference temperature value change and the operation temperature value change exceeds the fault range in the same time period.

First, at a temperature measuring step S100, internal temperature values of junction boxes and surface temperature values of solar modules are measured by the temperature sensor unit. At a temperature value signal transmitting step S200, the temperature values measured at the temperature measuring step S100 respectively are converted into temperature value signals including respective identifiers of the solar modules, and the temperature value signals are transmitted to the operation unit 150, which is an example of the fault diagnosis unit.

At a solar module whole fault diagnosis step S300, among the temperature value signals, the operation unit 150 compares the surface temperature values of the solar modules with each other. The operation unit determines a solar module having a surface temperature value that is beyond a preset range has whole faults.

At a solar module partial fault diagnosis step S400, among the temperature value signals, the operation unit 150 compares the internal temperature values of the junction boxes with each other.

The operation unit determines a solar module having an internal temperature value that is beyond a preset range has partial faults. Here, when a solar array 110 has a fault, a bypass diode is operated. In this case, due to heat from the bypass diode, an internal temperature of the junction box increases by 30 degrees or more.

Therefore, partial faults of the solar module may be determined by measuring the internal temperature value of the junction boxes.

At a fault displaying step S500, both whole faults or partial faults of the solar module determined by the operation unit 150 and information about the whole faults or partial faults are displayed on a corresponding region of solar module regions 161*a* and 161*b* of the display unit 160.

Figure 6:
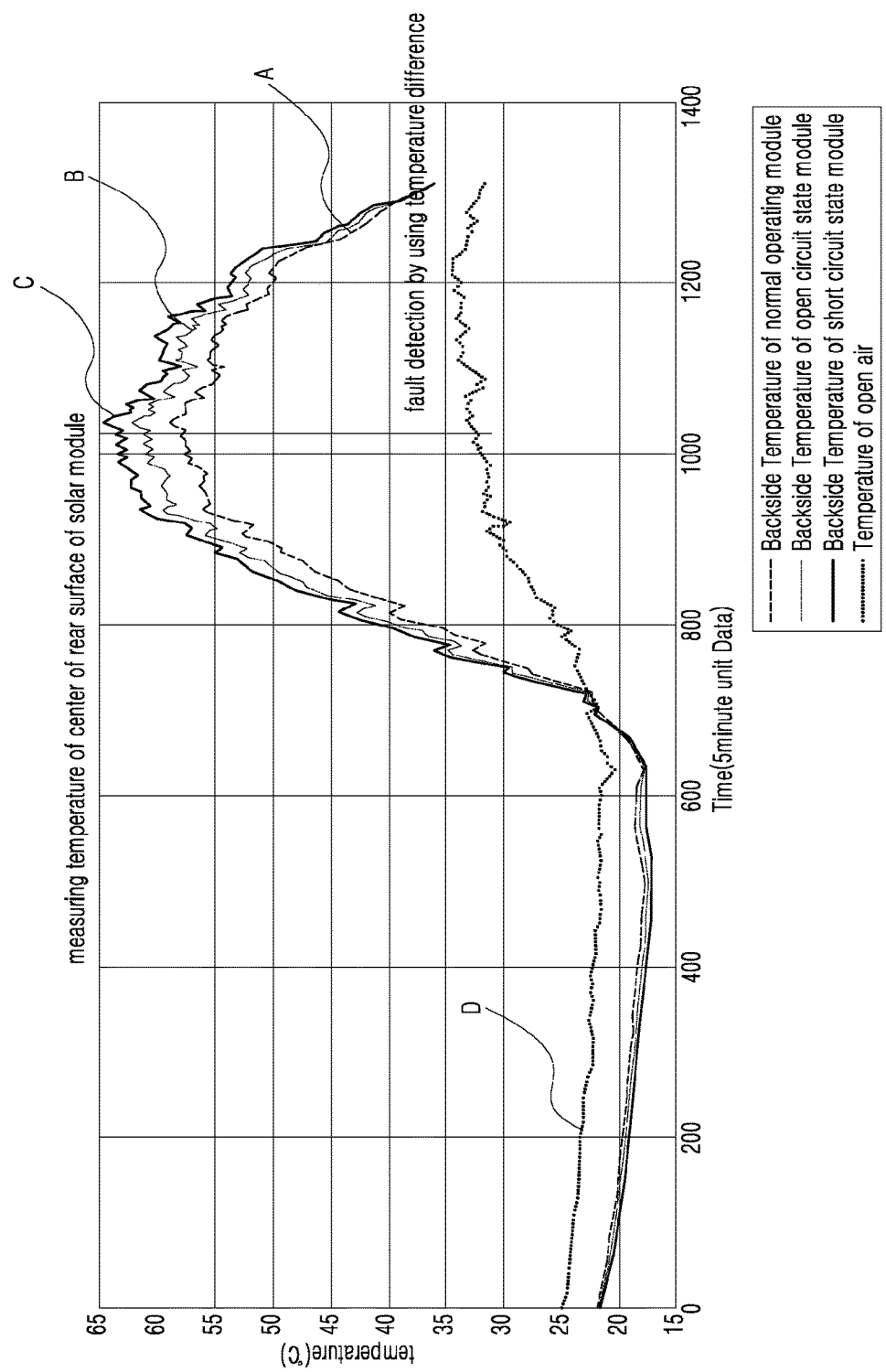
FIG. 6 is a temperature change graph of the solar module showing a reference temperature value change A, and fault diagnosis ranges B and C respectively measured in an open-circuit state and in a short-circuit state of the solar module.

FIG. 6 is a temperature change graph of the solar module showing a reference temperature value change A and fault diagnosis ranges B and C respectively measured in an open-circuit state and in a short-circuit state of the solar module. FIG. 6 shows the reference temperature value change A of the inside of the junction box 120 during operation of a normal solar module; an open-circuit state fault temperature value change B of the inside of the junction box 120 during operation of an open-circuit state solar module, which is an example of a common fault; a short-circuit state fault temperature value change C of the inside of the junction box 120 during operation of a short-circuit state solar module, which is another example of a common fault; and an outside air temperature value change D. Therefore, when using the information of FIG. 6, it is possible to determine a solar module fault in an open-circuit state and a solar module fault in a short-circuit state by measuring internal temperature values of the junction box.

Specifically, as shown in FIG. 6, at dawn, a value of the reference temperature value change A of the inside of the junction box 120 during operation of a normal solar module is almost similar to values of fault temperature value changes B and C of the inside of the junction box 120 during operation of a solar module in an open-circuit state or in a short-circuit state. From the time the Sun rises, the value of the reference temperature value change A is different from the values of fault temperature value changes B and C. The difference is a maximum at the time from 1 to 2 in the afternoon.

As time passes, the value of the reference temperature value change A is similar to the values of fault temperature value changes B and C again. That is, the difference between the reference temperature value change A and the fault temperature value changes B and C is calculated, and the difference is set as a fault diagnosis range. In comparison with the reference temperature value change A and with the fault temperature value changes B and C, the outside air temperature value change D has a narrow change range. Therefore, when determining the solar module has a fault by measuring a temperature value of a rear surface of the solar array 110, the influence of the outside air temperature is very small.

The data of FIG. 6 shows that various diagnoses for the solar module may be performed by using the internal temperature value change of the junction box 120.

In a case of a large scale photovoltaic farm, the state of each solar array 110 is determined by measuring and analyzing voltage, current, etc. of the solar module using the conventional technologies. However, it has problems that initial investment costs are high and the measurement accuracy is low due to using different devices depending on voltage range.

In the case of the conventional technologies, in a large scale photovoltaic farm, when a photovoltaic battery (about 250 W, 35V-one module) has a fault due to an open-circuit or a short-circuit thereof during operation of the photovoltaic battery, a bypass diode of a solar module is operated. When two elements (solar cell, bypass diode, etc.) have faults, the faults may be detected by a system at an inverter terminal.

In addition, a device for measuring voltage power is provided at each string. When the device is provided at each module, excessive initial investment costs are required. When measuring voltage values, voltage values of solar modules are different from each other and thus, it is difficult to detect the same voltage values.

However, according to the present invention, the fault diagnosis method by measuring temperature values applies a fault diagnosis range that is preset at an initial installation. The fault diagnosis method uses a temperature sensor and a wireless communication module such as a Zigbee device. Therefore, in comparison with the conventional technologies, an initial investment cost is inexpensive and the fault diagnosis method has a competitive price in consideration of maintenance costs.

In addition, the temperature sensor unit has a sleep mode to reduce standby power. In the sleep mode, the temperature sensor unit transmits data once a day, thereby reducing operation power. In addition, the sleep mode may be changed by an installer. According to the present invention, the temperature of the solar module is measured by a temperature sensor of –20-150° C. such that an inexpensive sensor may be used.

In addition, according to a conventional photovoltaic battery fault diagnosis method, a photovoltaic battery is checked by an infrared light measuring device for measuring temperatures, or by the naked eye, etc. Next, the photovoltaic battery is demounted to be checked for a fault by using an I-V curve tracer. Consequently, whole faults or partial faults of the solar module are determined by using identifiers of solar cell panels, identifiers of solar modules, determining whether or not the solar module can communicate, and abnormal temperature change, thereby enhancing efficiency in term of maintenance.

According to the first exemplary embodiment of the fault diagnosis method for the photovoltaic system disclosed the operation unit 150 as an example of the fault diagnosis unit. However, the fault diagnosis unit may be a measuring device, etc. determining a fault of a solar module far from the fault diagnosis unit.

Figure 5B:
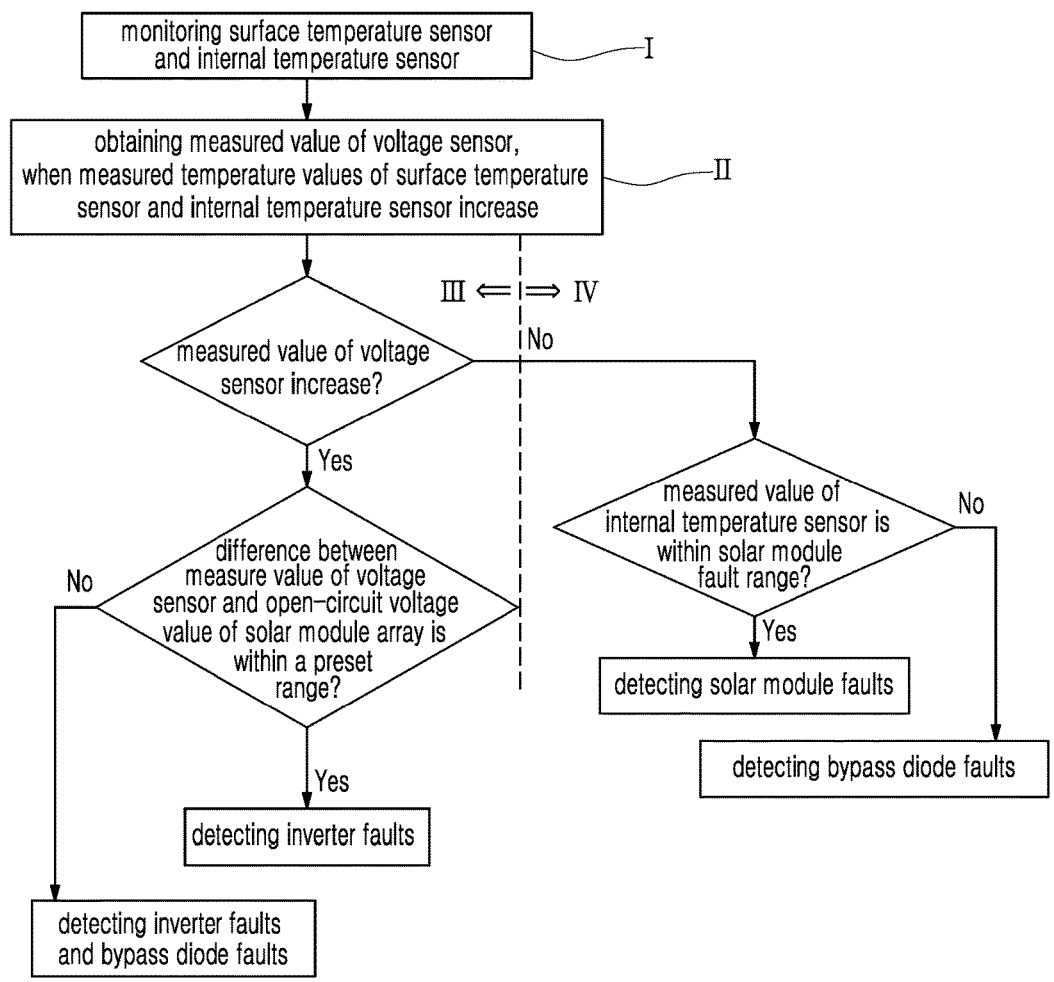
FIG. 5b is a flowchart showing a second exemplary embodiment of a fault diagnosis method for the photovoltaic system.

Next, a second exemplary embodiment of a fault diagnosis method for the photovoltaic system shown in FIG. 5b will be described. As shown in FIG. 5b, the second exemplary embodiment of a fault diagnosis method for the photovoltaic system includes: step I of monitoring the surface temperature sensor and the internal temperature sensor; step II of obtaining the measured value of the voltage sensor, when the measured temperature values of the surface temperature sensor and the internal temperature sensor are respectively higher than those of the normal operation condition; and step IV of determining whether or not one of the solar module and the bypass diodes have faults by inspecting the measured value of the voltage sensor and the solar panel, when the measured value of the voltage sensor is higher than that of the normal operation condition.

Here, there is no temporal order between step III of determining whether or not the inverter 730 has a fault and the step IV of determining whether or not one of the solar array 110 and the bypass diodes 124 have faults, because they are difference cases.

According to the second exemplary embodiment of a fault diagnosis method for the photovoltaic system, the surface temperature sensor 125b and the internal temperature sensor 125a as well as the voltage sensor 131 are provided in the junction box. Therefore, it is possible to determine inverter faults and bypass diode faults without checking by the naked eye.

Figure 7:
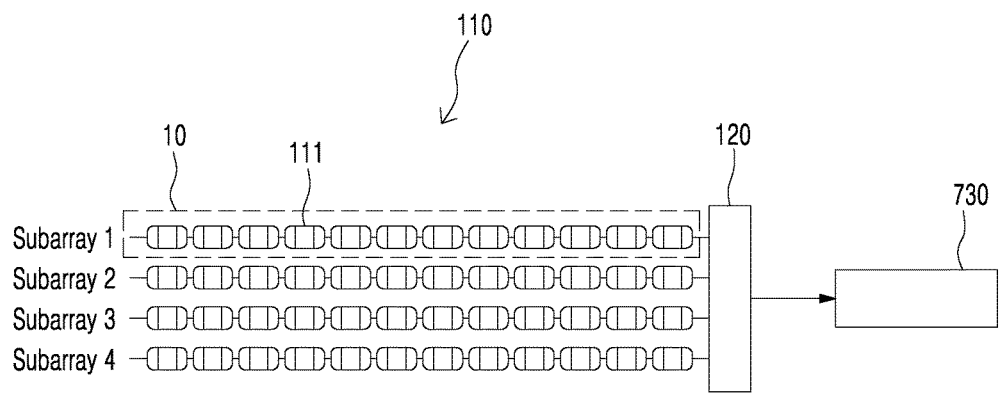
FIG. 7 shows the connection relationship of a photovoltaic system.

As shown in FIG. 7, an inverter 730 is connected to a solar subarray (or string) 10 through the junction box 120. It is possible to determine whether or not the inverter 730 has a fault by comparing a voltage value of the solar subarray 10 in a normal operating condition with an open-circuit state voltage value. Like a fault of the solar array 110, the faults of the inverter 730 or of the bypass diode cause heat at a surface of the solar array 110. In addition, like a fault of the solar array 110, the faults of the inverter 730 or of the bypass diode cause an increase in the internal temperature of the junction box 120. Therefore, when the measured values of the surface temperature sensor 125b and the internal temperature sensor 125a increase, the solar array 110 may have a fault, or the inverter 730 or the bypass diode 124 may have a fault.

A diode allows an electric current to pass in forward direction while blocking current in the reverse direction. In the case that the diode 124 (referring to FIG. 4) is connected to the solar module in parallel, the diode 124 blocks power of a storage battery from flowing backward when the solar module fails due to shade, snow drifts, etc., or various lower power output states occur, or power degradations occur due to night time or cloudy weather. When the bypass diode 124 has a fault, current of a normal solar panel flows into a faulty solar panel. Consequently, the normal solar panel 111 develops a fault. Therefore, it is required to monitor whether or not the bypass diode 124 has a fault.

In addition, it is required to protect the inverter 730 converting the direct current power generated by the solar array 110 into alternating current power required for an electric load. The determining of whether or not the inverter 730 has a fault by comparing the measured value of the voltage sensor with the open-circuit voltage value of the solar module array includes inspecting whether or not the inverter 730 has a fault, when the measured value of the voltage sensor is equal to the open-circuit voltage value of the solar subarray 10. A voltage value of the solar array 110 varies depending on solar radiation. When the inverter 730 stops, the voltage value of the solar array 110 is equal to the open-circuit voltage value, which is higher than a voltage value of a normal operating condition. Therefore, in the case that the measured values of the surface temperature sensor 125b and the internal temperature sensor 125a increase, when the measured value of the voltage sensor 131 increases, the inverter may be stopped as shown in FIG. 5b. In this case, the open-circuit of the solar array 110 causes increases in the measured values of the surface temperature sensor 125b and the internal temperature sensor 125a. Here, the step III of determining whether or not the inverter 730 has a fault by comparing the measured value of the voltage sensor 131 with the open-circuit voltage value of the solar subarray 10 includes inspecting whether or not the inverter 730 and the bypass diodes 124 have faults, when a difference between the measured value of the voltage sensor and the open-circuit voltage value of the solar module array is equal to or greater than a preset range, and during a maximum solar radiation period, a current that is equal to a short circuit current flows to the bypass diodes, and the measured temperature values rapidly increase.

Figure 8:
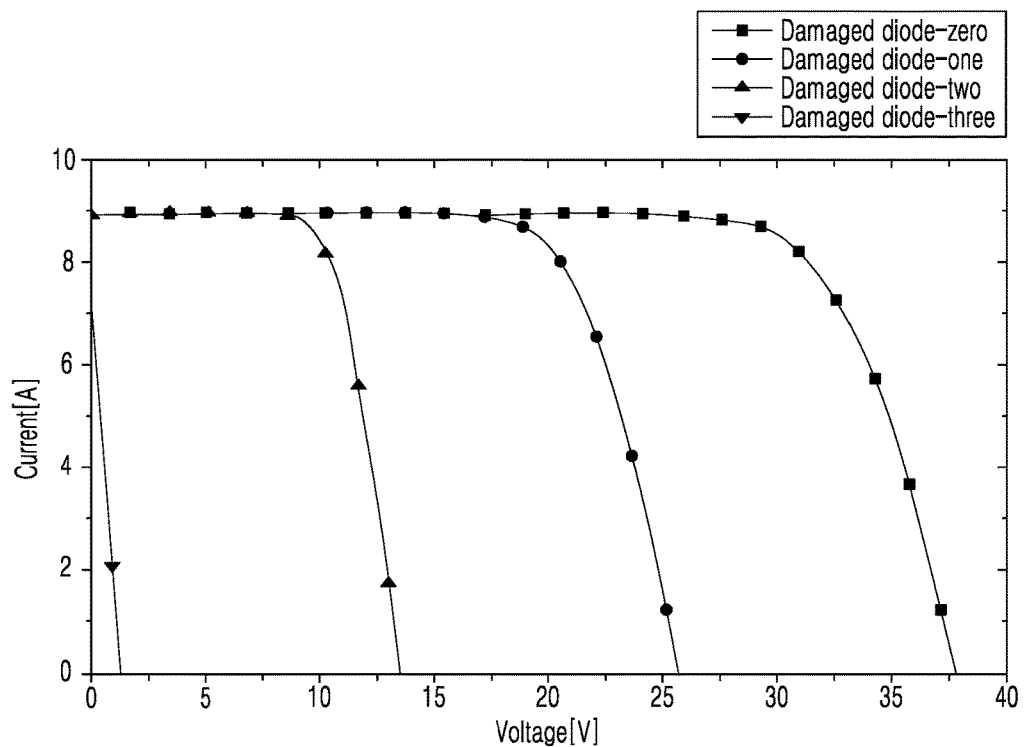
FIG. 8 is a graph showing a voltage-current characteristic according to the number of faulty bypass diodes.
Figure 9:
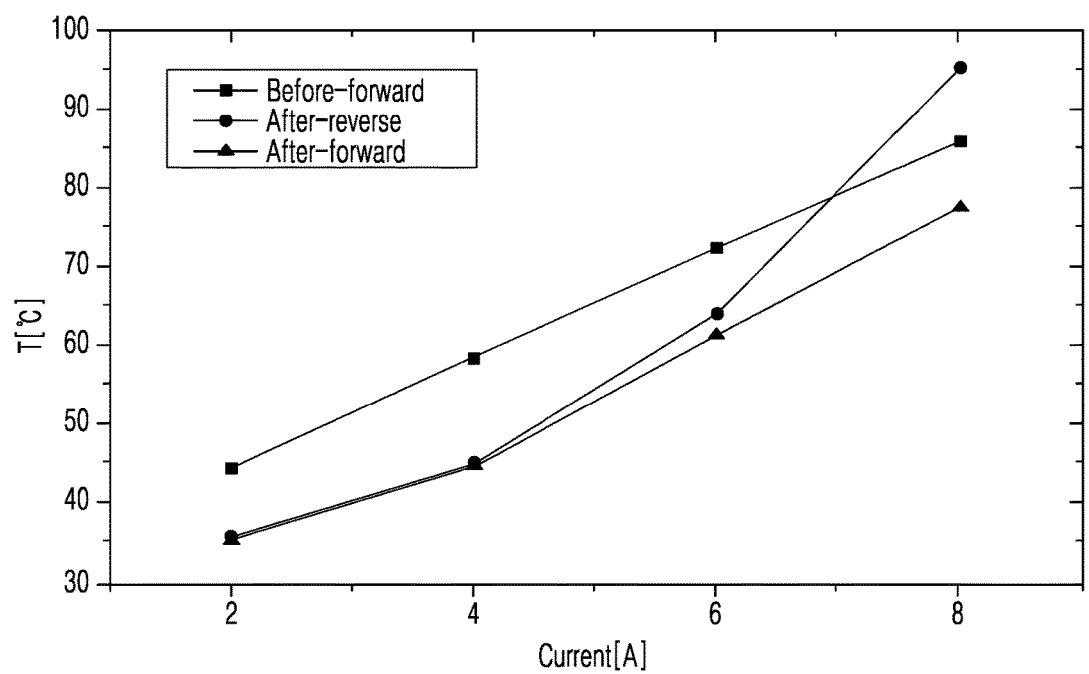
FIG. 9 is a graph showing a temperature characteristic according as a function of current by bypass diode connected direction.

When both the inverter 730 and the bypass diode 124 have faults, current flows to the bypass diode 124 during the open-circuit state period of the solar module. Therefore, during a maximum solar radiation period, the current equal to a short-circuit state current passes through the bypass diode 124. Here, the temperature of the solar module rapidly increases, the voltage value of the voltage sensor 131 is [voltage of solar panel X (number of total bypass diodes−number of faulty bypass diodes)]/(number of total bypass diodes). FIG. 8 shows a voltage-current graph of this case.

However, when the solar radiation is small, there is no rapid increase in the measured temperature values. Therefore, in the case that the measured value of the voltage sensor 131 is different from the open-circuit state voltage value of the solar subarray 10 more than a preset range, the preset range is a range for determining the bypass diodes 124 have faults when a difference between a reduced voltage value and an open-circuit state voltage value is beyond an error range due to the bypass diode faults. In the meantime, the fault range is out of a range between the upper limit and the lower limit of measured values of the temperature value change of normal solar modules.

The step IV of determining whether or not one of the solar array 110 and the bypass diodes 124 have faults includes: inspecting whether or not the bypass diodes 124 have faults when the measured temperature value of the internal temperature sensor 125a is lower than the fault range; and inspecting whether or not the solar array 110 has a fault when the measured temperature value of the internal temperature sensor 125a is within the fault range. That is, when the measured value of the voltage sensor is lower than that of the normal operation condition at the step II, the solar array 110 and the bypass diodes 124 may have faults, while the inverter 30 does not a fault. Here, when a measured value of the internal temperature sensor 125a is within a fault range that is a range of measured values of a faulty solar array 110, the solar array 110 may have a fault. However, when a measured value of the internal temperature sensor 125a is lower than the fault range that is a range of the measured values of the faulty solar array 110, the bypass diodes 124 may have faults. In comparison with an internal temperature value of the junction box 120 in the case that the solar array 110 has low output due to shade, snow drifts, or contamination, an internal temperature value of the junction box 120 in the case that the bypass diodes 124 have faults is lower than that of a short-circuit state reference current value (about 8 A) which is more than 10 degrees. However, in spite of this case, exhaustive maintenance may be performed by checking whether or not the solar array 110 has a fault.

Although embodiments of the present invention were described in detail above, the scope of the present invention is not limited to the embodiments and various changes and modifications from the spirit of the present invention defined in the following claims by those skilled in the art are also included in the scope of the present invention.

What is claimed is:

1. A fault diagnosis apparatus of a photovoltaic system, the photovoltaic system including: a solar module including a plurality of solar cells arranged in a grid; a junction box connected to the solar module to output direct current power generated by the solar module; an inverter converting the direct current power generated by the solar module into alternating current power required for an electric load; and a server communication unit communicating with the solar module, the fault diagnosis apparatus comprising:
a temperature sensor unit measuring both an internal temperature value of the junction box and a surface temperature value of the solar module;
a voltage sensor provided in the junction box;
bypass diodes provided in the junction box and connected in parallel with the solar cells; and
an operation unit determining where a fault occurs among the solar module, the bypass diodes, and the inverter by referring to measured values of the temperature sensor unit and a measured value of the voltage sensor.

2. The apparatus of claim 1, wherein the temperature sensor unit comprises:
a surface temperature sensor measuring the surface temperature value of the solar module;
an internal temperature sensor measuring the internal temperature value of the junction box;
a temperature value signal generating unit generating a temperature value signal by adding an identifier of the solar module to the measured temperature values of the surface temperature sensor and the internal temperature sensor; and
a junction box communication unit transmitting the temperature value signal generated by the temperature value signal generating unit to a fault diagnosis unit.

3. The apparatus of claim 1, wherein the operation unit is configured to determine that the solar module has a fault when it is impossible for the operation unit to receive information about an operation temperature value change of the solar module.

4. The apparatus of claim 2, wherein the junction box comprises:
one or more bus bars having first ends respectively connected to lines of the solar cells of the solar module;
the bypass diodes connecting the bus bars to each other;
the temperature sensor unit measuring an operation temperature value of an inside of a case unit at preset time intervals during operation of the solar module; and
the junction box communication unit converting the measured operation temperature value into a measured temperature value signal, and transmitting the measured temperature value signal to the external fault diagnosis unit.

5. The apparatus of claim 4, wherein the surface temperature sensor, the internal temperature sensor, and the voltage sensor are connected to a connection terminal unit provided at second ends of the bus bars in the junction box, and are operated by receiving the direct current power generated by the solar module.

6. The apparatus of claim 1, wherein the operation unit divides a display region of a display unit into solar module regions corresponding to positions of solar modules, and
the apparatus further comprising:
the display unit displaying identifiers of the solar modules and whether or not the solar modules have faults on respective solar module regions.

7. A fault diagnosis method for the photovoltaic system having the fault diagnosis apparatus of claim 1, the method comprising:
measuring, by a surface temperature sensor at a reference temperature value measuring step, a temperature value change of each solar module for a preset time when the solar module is in a normal operating condition generating the direct current power, and storing the temperature value change as a reference temperature value change;
measuring, at a fault range setting step, a fault temperature value change of the solar module for the preset time when the solar module has a fault, and setting a difference between the reference temperature value change and the fault temperature value change in the same time period as a fault range;
measuring, by the surface temperature sensor at an operation temperature value measuring step, an operation temperature value change of the solar module for the preset time, and transmitting the operation temperature value change, the solar module generating the direct current power; and
determining, by the operation unit at a fault diagnosis step, the solar module has a fault when a difference between the reference temperature value change and the operation temperature value change exceeds the fault range in the same time period.

8. The method of claim 7, wherein the preset time for calculating the reference temperature value change is chosen among the day, the month, and the season.

9. The method of claim 7, wherein the fault diagnosis step comprises:
determining a solar module has a fault when it is impossible for the operation unit to receive the operation temperature value change of the solar module.

10. A fault diagnosis method for the photovoltaic system having the fault diagnosis apparatus of claim 1, the method comprising:
monitoring a surface temperature sensor and an internal temperature sensor;
obtaining the measured value of the voltage sensor, when measured temperature values of the surface temperature sensor and the internal temperature sensor are respectively higher than those of the normal operation condition;
determining whether or not the inverter has a fault by comparing the measured value of the voltage sensor with an open-circuit voltage value of a solar module array, when the measured value of the voltage sensor is higher than that of the normal operation condition; and
determining whether or not one of the solar module and the bypass diodes have faults by obtaining the measured temperature value of the internal temperature sensor, when the measured value of the voltage sensor is lower than that of the normal operation condition.

11. The method of claim 10, wherein the determining of whether or not the inverter has a fault by comparing the measured value of the voltage sensor with the open-circuit voltage value of the solar module array comprises:
inspecting whether or not the inverter has a fault, when the measured value of the voltage sensor is equal to the open-circuit voltage value of the solar module array.

12. The method of claim 10, wherein the determining of whether or not one of the solar module and the bypass diodes have faults comprises:
inspecting whether or not the bypass diodes have faults when the measured temperature value of the internal temperature sensor is lower than a fault range; and
inspecting whether or not the solar module has a fault when the measured temperature value of the internal temperature sensor is within the fault range.

13. A photovoltaic system having a fault diagnosis apparatus comprising:
a solar module including a plurality of solar cells arranged in a grid;
a junction box connected to the solar module to output direct current power generated by the solar module;
an inverter converting the direct current power generated by the solar module into alternating current power required for an electric load;
a server communication unit communicating with the solar module;
a temperature sensor unit measuring both an internal temperature value of the junction box and a surface temperature value of the solar module;
a voltage sensor provided in the junction box;
bypass diodes provided in the junction box and connected in parallel with the solar cells; and
an operation unit determining where a fault occurs among the solar module, the bypass diodes, and the inverter by referring to measured values of the temperature sensor unit and a measured value of the voltage sensor.

* * * * *